(12) United States Patent
Tamura et al.

(10) Patent No.: US 6,249,472 B1
(45) Date of Patent: Jun. 19, 2001

(54) SEMICONDUCTOR MEMORY DEVICE WITH ANTIFUSE

(75) Inventors: Yoshimitsu Tamura, Chiba; Takumi Nasu, Tsuchiura; Hideyuki Fukuhara, Ami-machi; Shigeki Numaga, Abiko, all of (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/215,109

(22) Filed: Dec. 18, 1998

(30) Foreign Application Priority Data

Dec. 25, 1997 (JP) .................................................. 9-367179

(51) Int. Cl.⁷ ...................................................... G11C 7/00
(52) U.S. Cl. ........................ 365/225.7; 365/200; 257/530
(58) Field of Search ................................ 365/225.7, 200, 365/96; 257/530

(56) References Cited

U.S. PATENT DOCUMENTS

Re. 35,828 * 6/1998 Lee ..................................... 365/225.7
5,134,457 * 7/1992 Hamdy et al. ........................ 257/530
5,770,885 * 6/1998 McCollum et al. .................. 257/530
5,838,620 * 11/1998 Zagar et al. .......................... 365/200

* cited by examiner

Primary Examiner—Huan Hoang
(74) Attorney, Agent, or Firm—William B. Kempler; Frederick J. Telecky, Jr.

(57) ABSTRACT

The objective of the invention is to provide a type of semiconductor memory device whose antifuse can be formed without any additional film manufacturing process. A first electrode is formed by a first polysilicon film 37 formed on semiconductor substrate 30 and a second polysilicon film 39 deposited on the surface of the first polysilicon film. The first electrode, a dielectric film formed on the surface of the first electrode, and a second electrode form capacitor 11 in the memory cell. An antifuse 12 with the same configuration as capacitor 11 is formed in the semiconductor memory device. Because there is no need to use an additional film, the manufacturing cost is low, and antifuse 12 can be easily arranged. It is also possible to form antifuse 13 by forming instead of depositing the second polysilicon film 39 on the surface of the first polysilicon film 39.

20 Claims, 15 Drawing Sheets

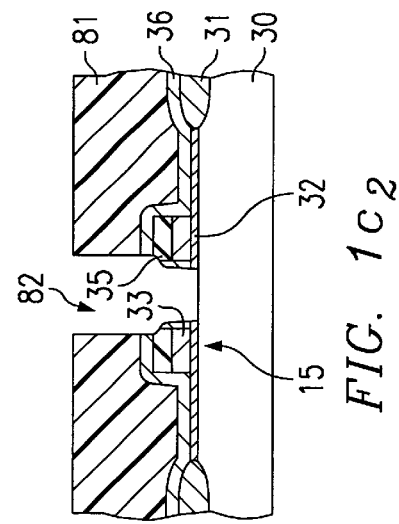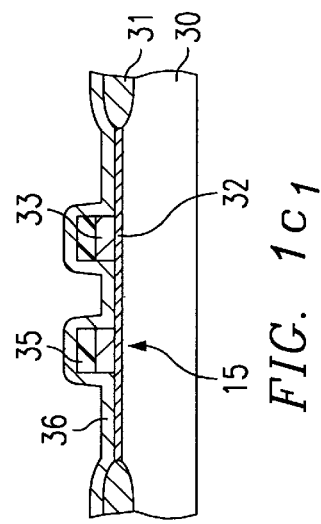
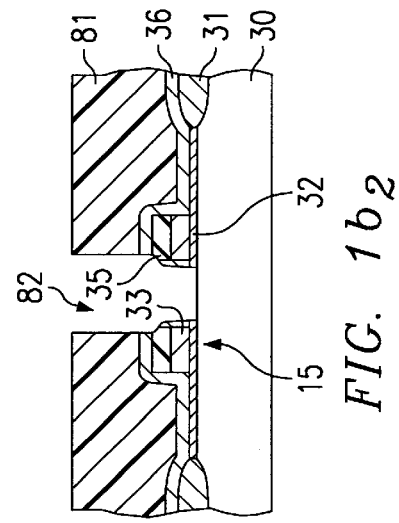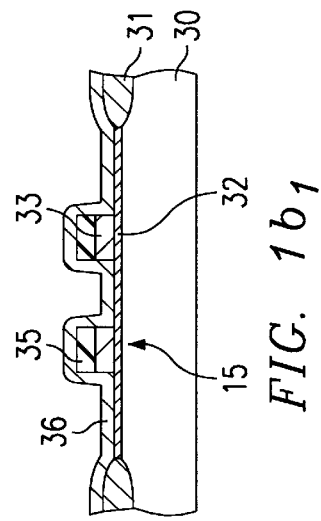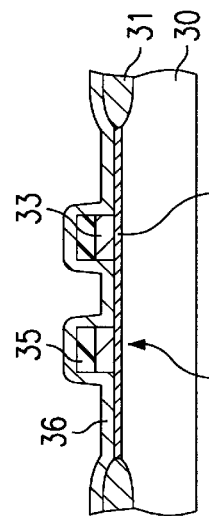
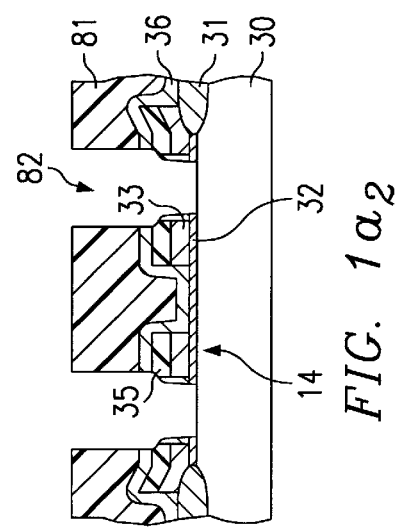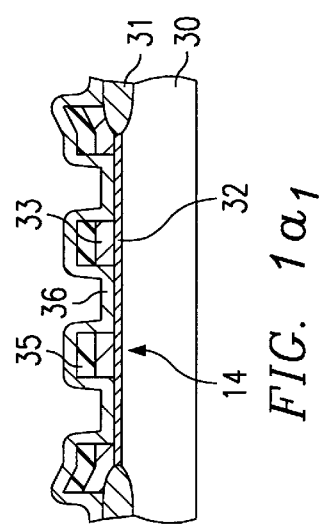

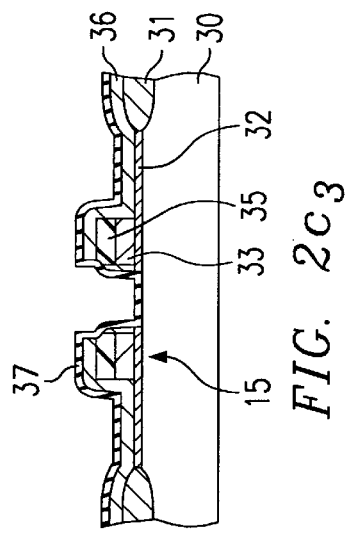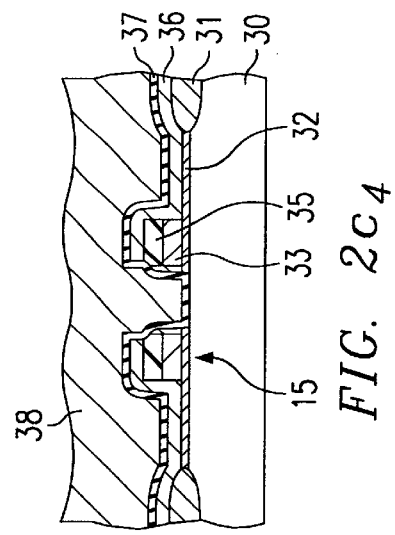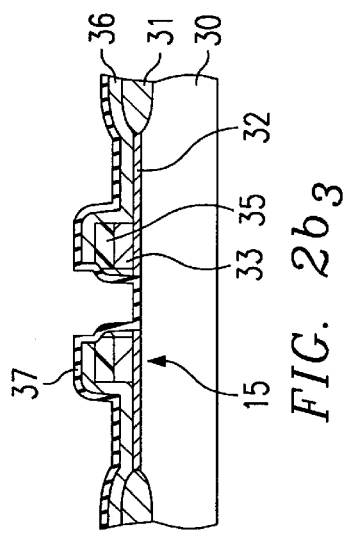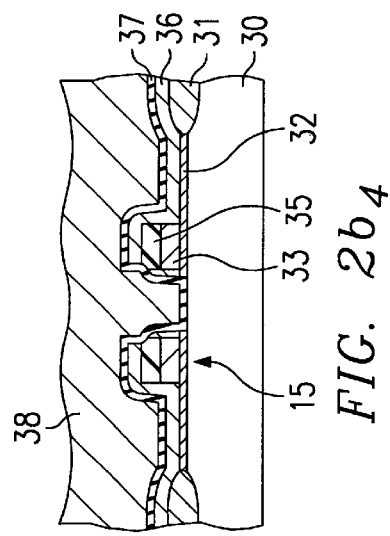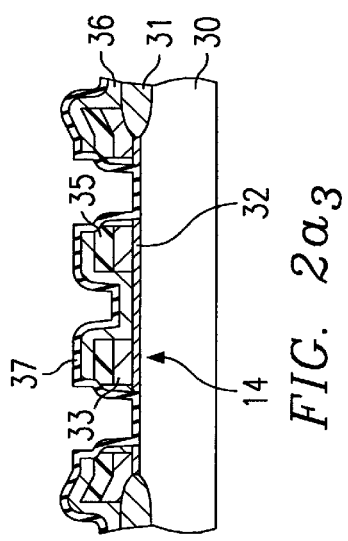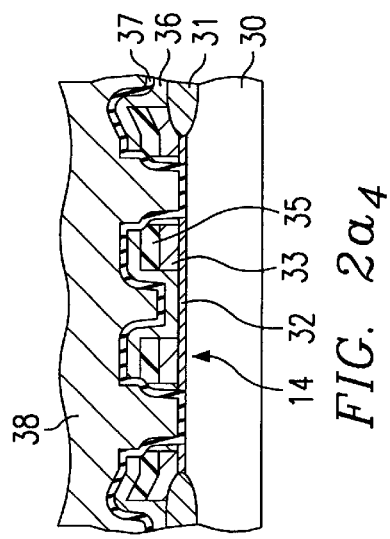

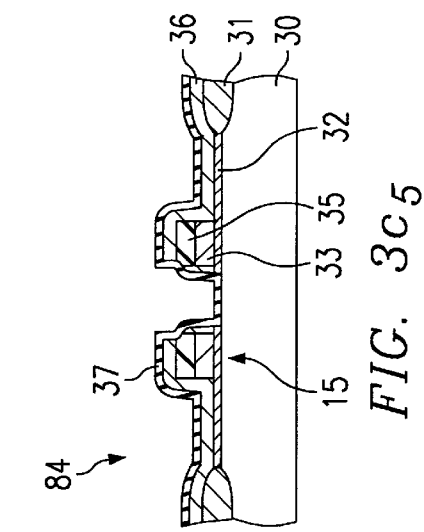
FIG. 3a5
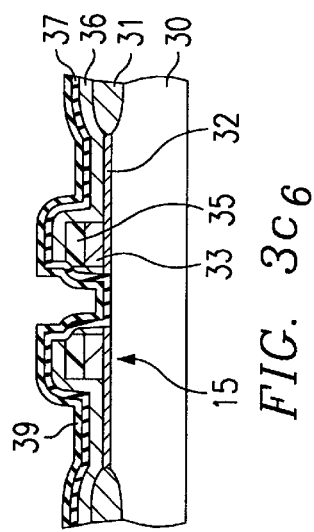
FIG. 3a6
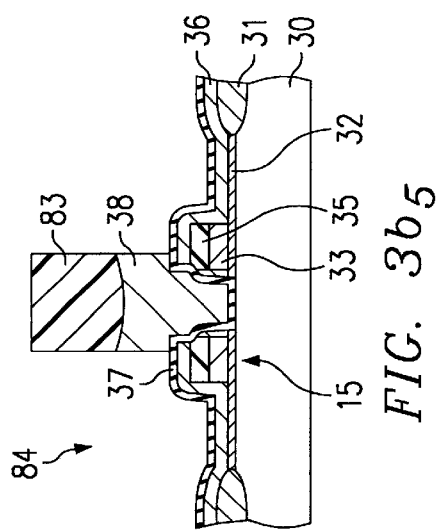
FIG. 3b5
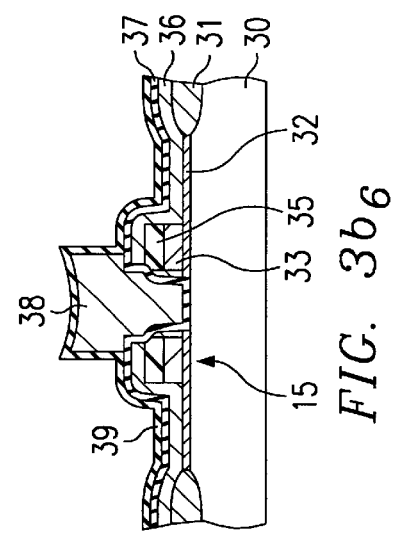
FIG. 3b6
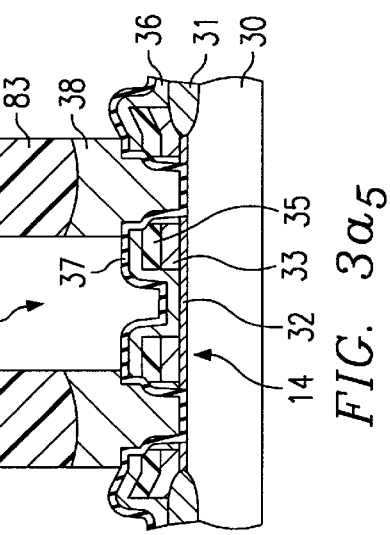
FIG. 3c5
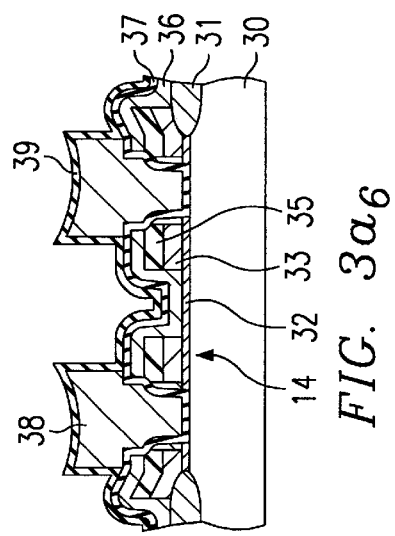
FIG. 3c6

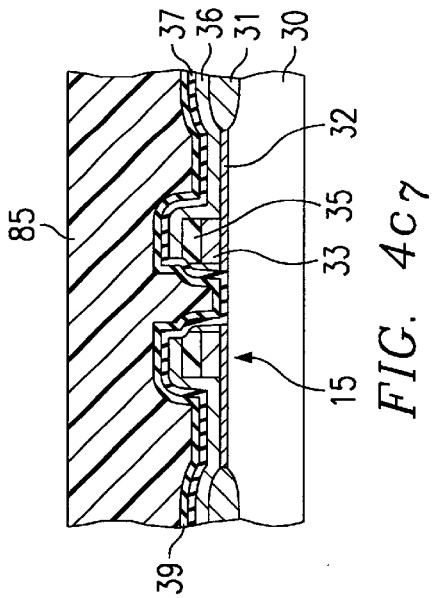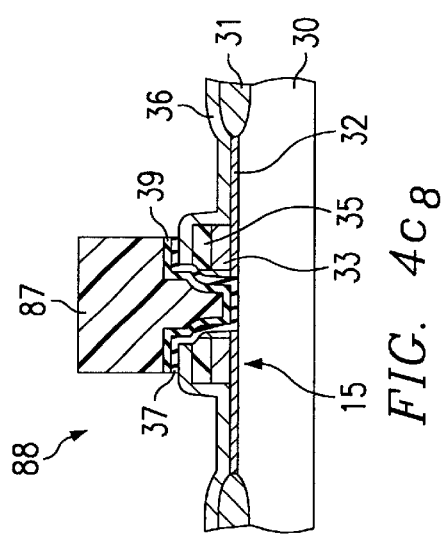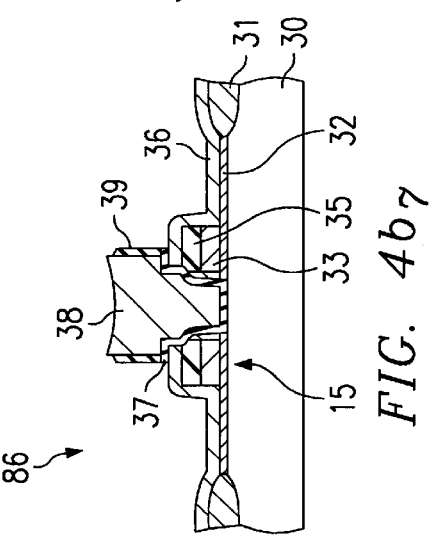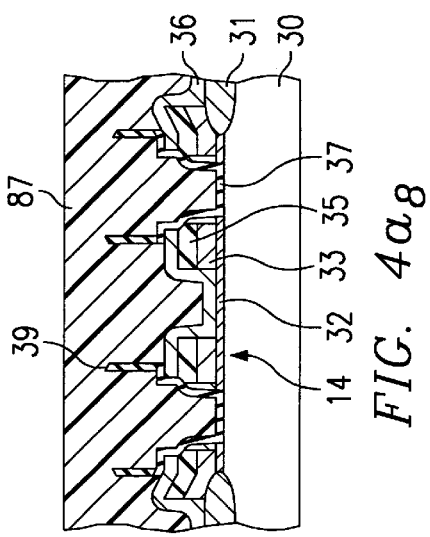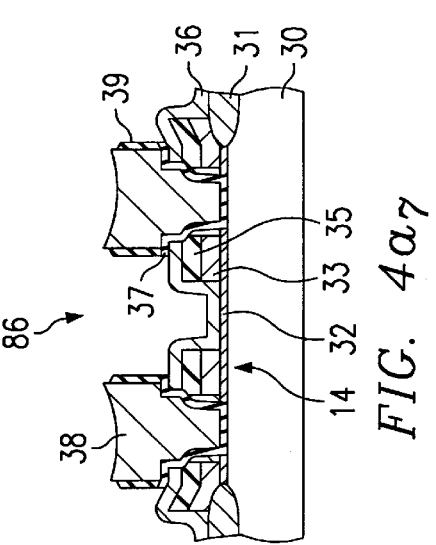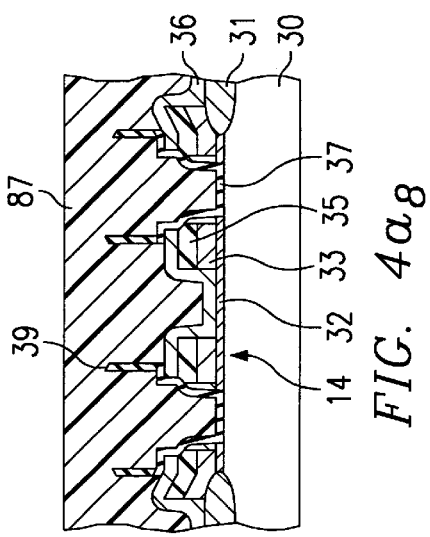

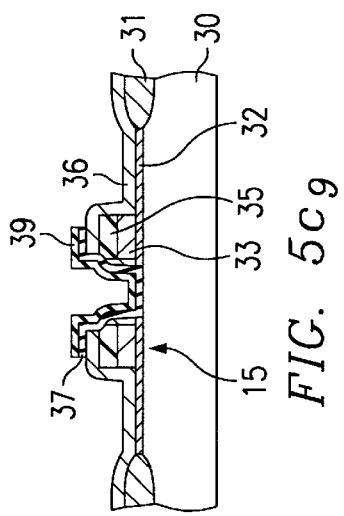
FIG. 5c₉
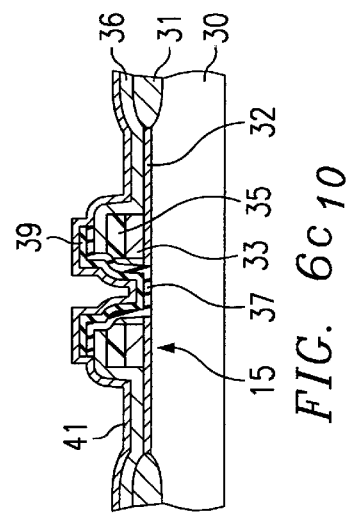
FIG. 6c₁₀
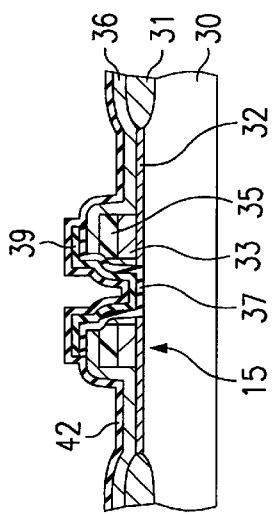
FIG. 6c₁₁
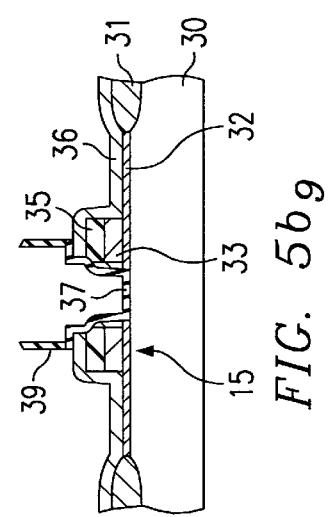
FIG. 5b₉
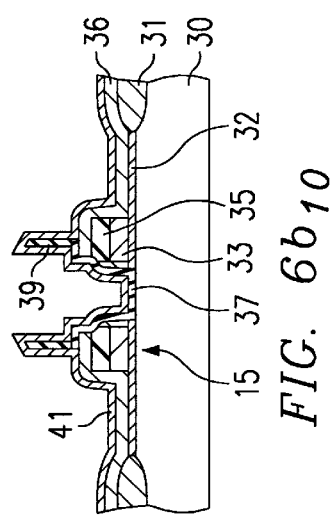
FIG. 6b₁₀
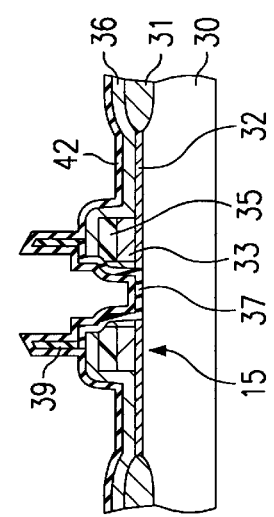
FIG. 6b₁₁
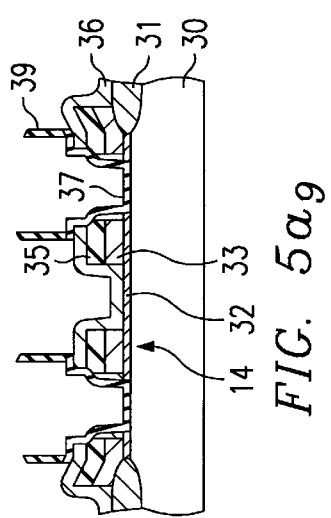
FIG. 5a₉
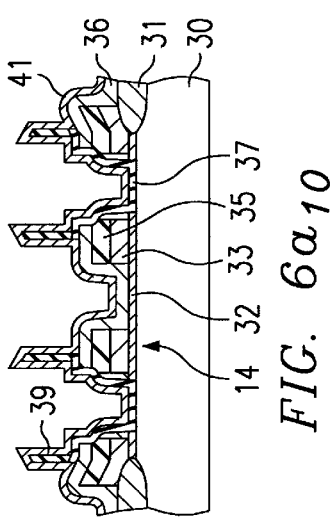
FIG. 6a₁₀
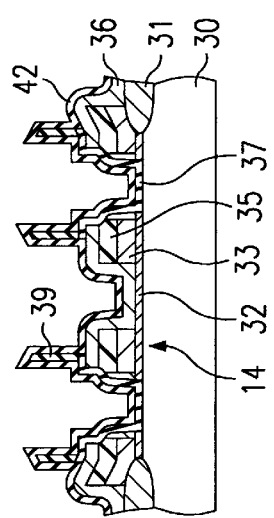
FIG. 6a₁₁

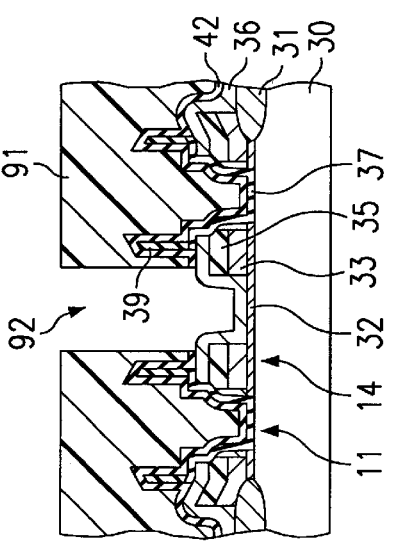
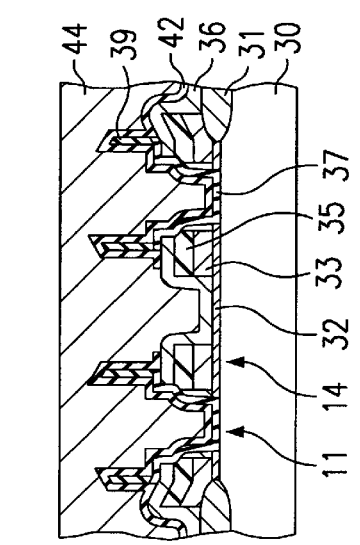
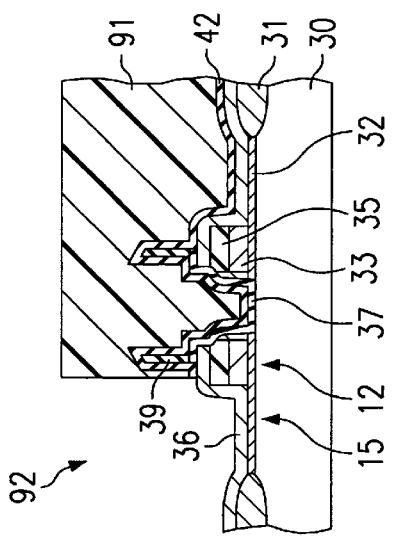
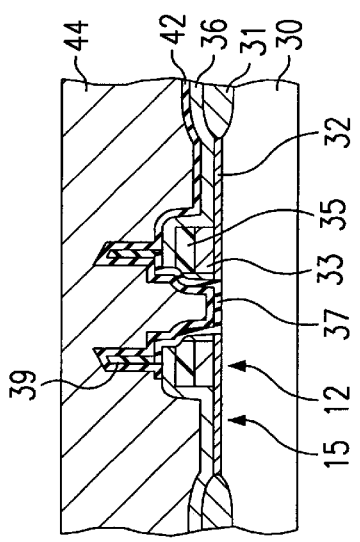
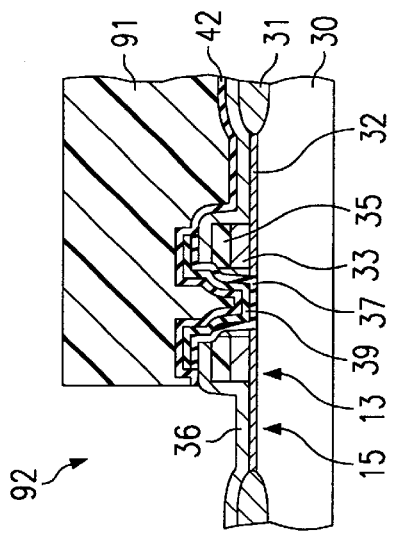
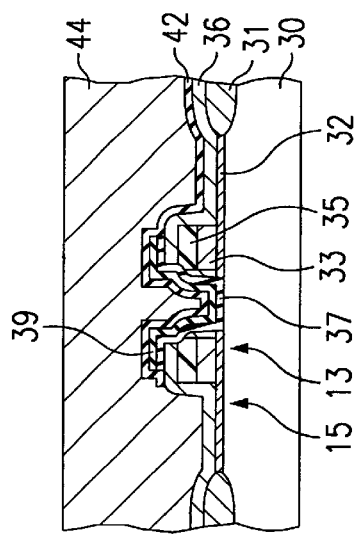

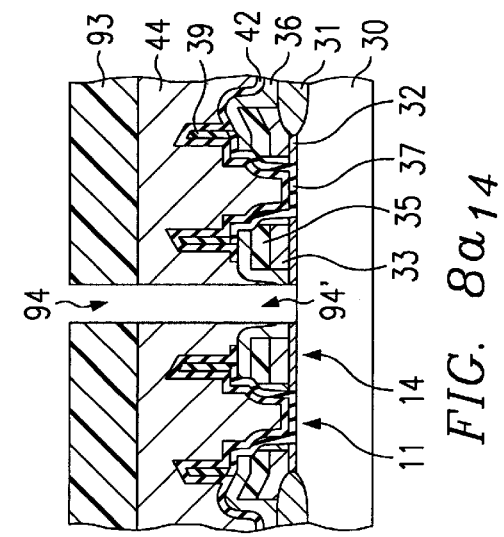
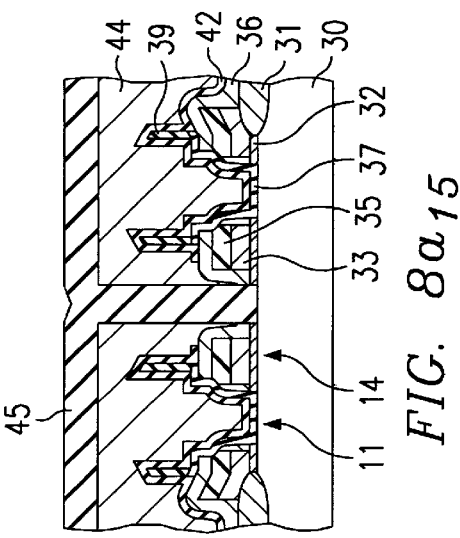
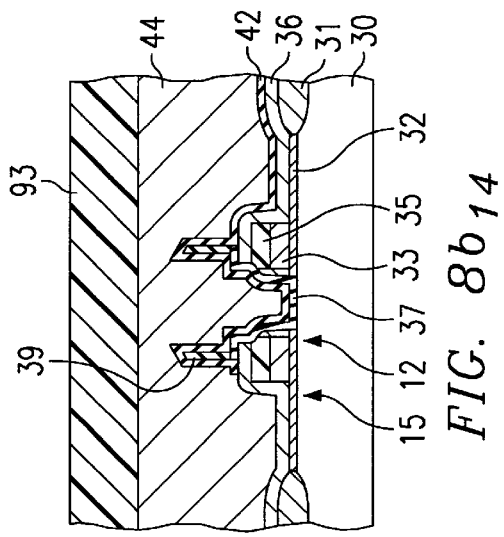
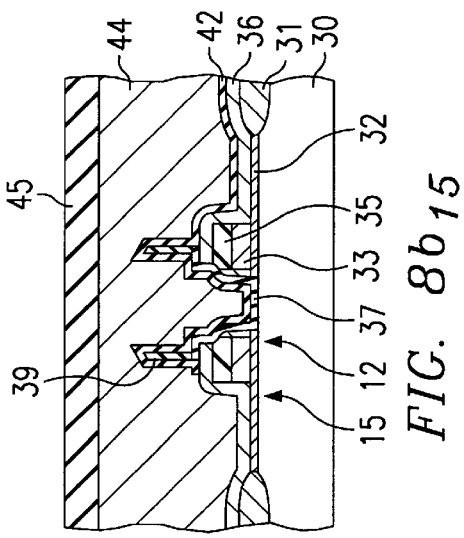
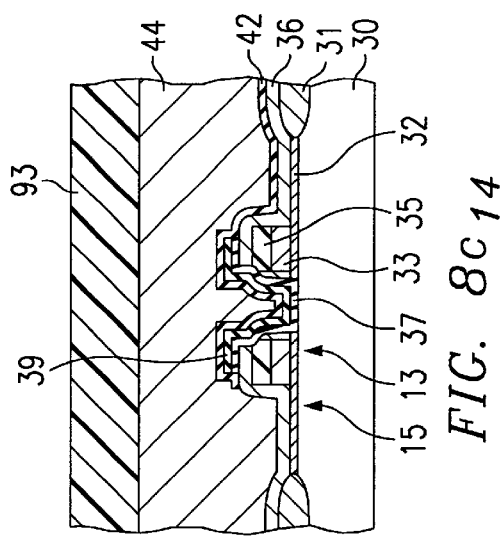
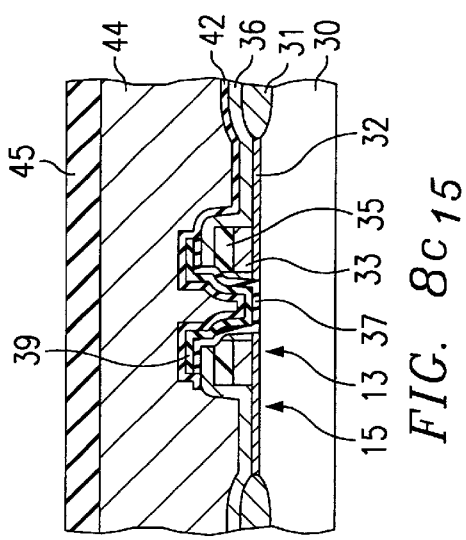

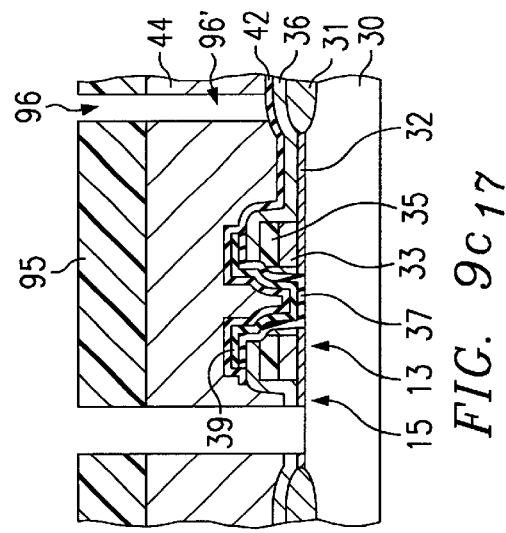
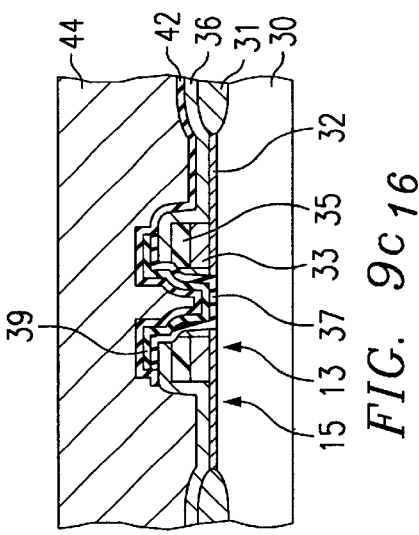
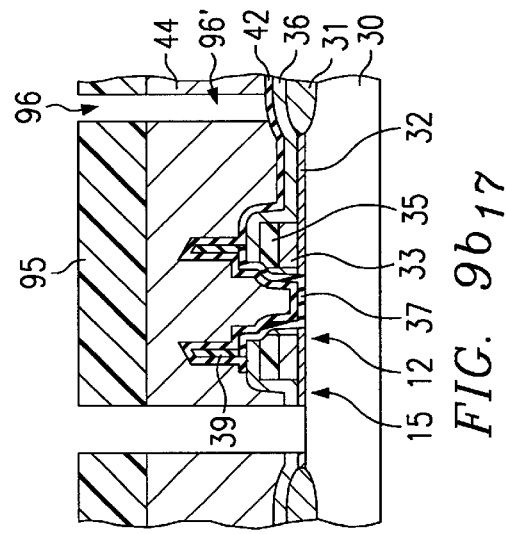
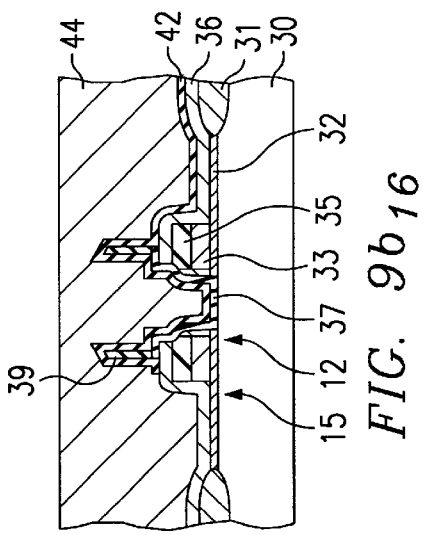
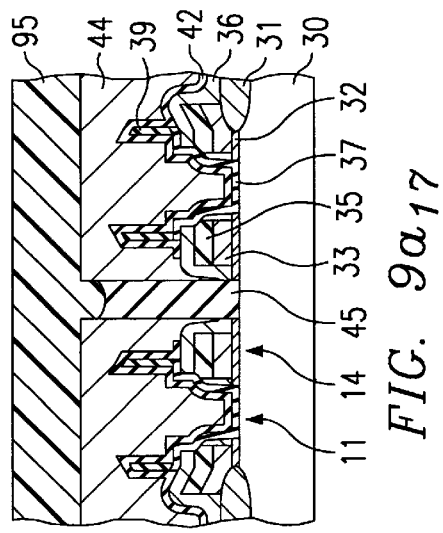
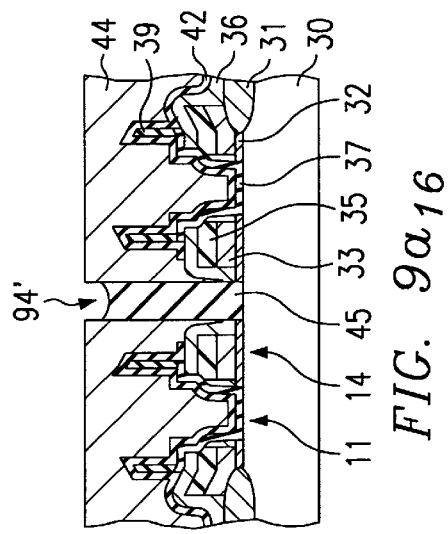

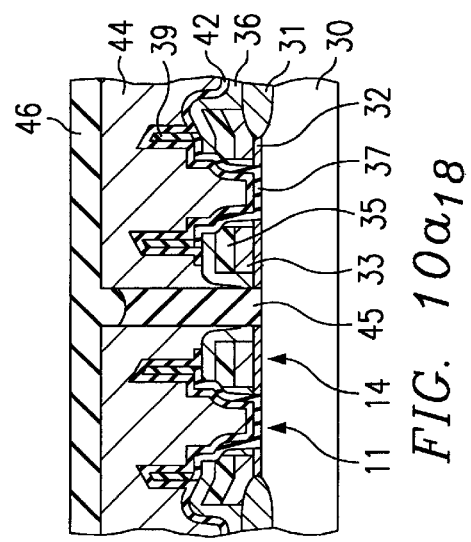
FIG. 10a₁₈
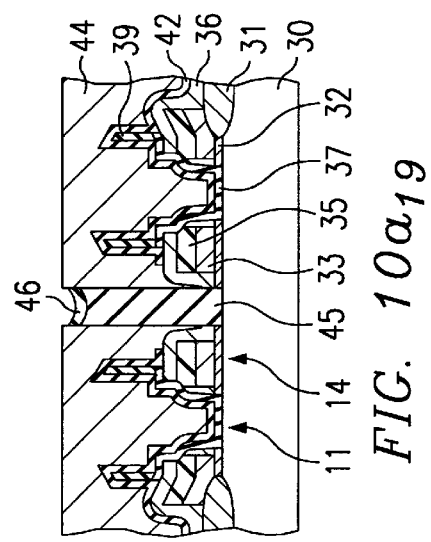
FIG. 10a₁₉
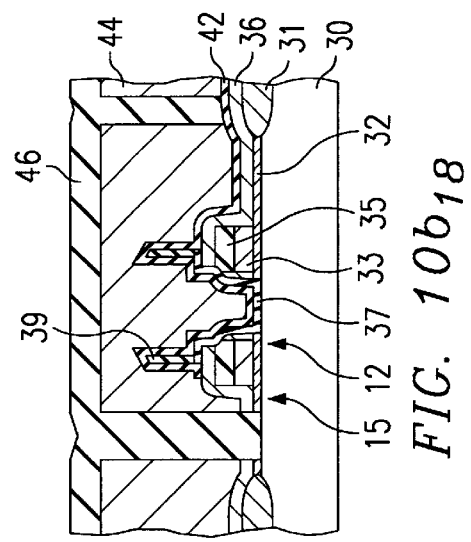
FIG. 10b₁₈
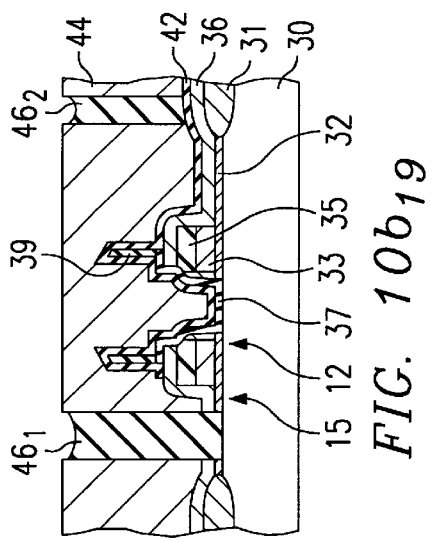
FIG. 10b₁₉
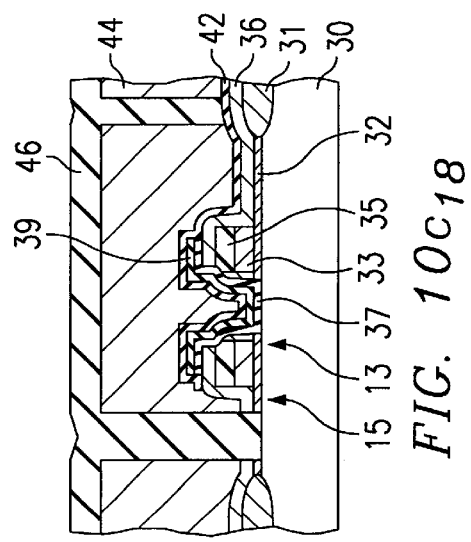
FIG. 10c₁₈
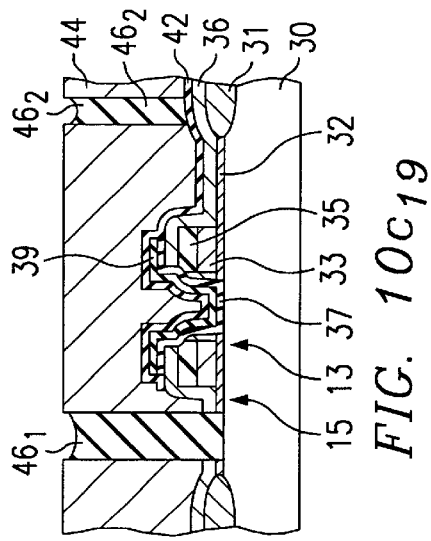
FIG. 10c₁₉

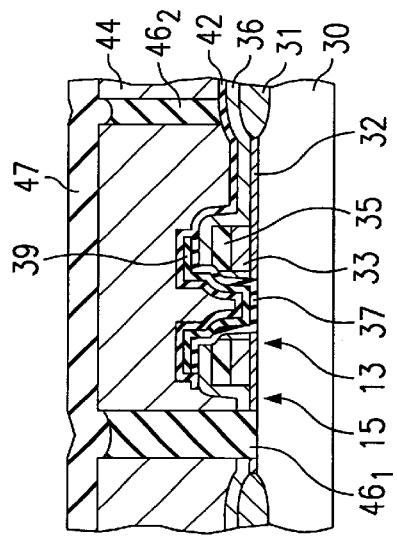
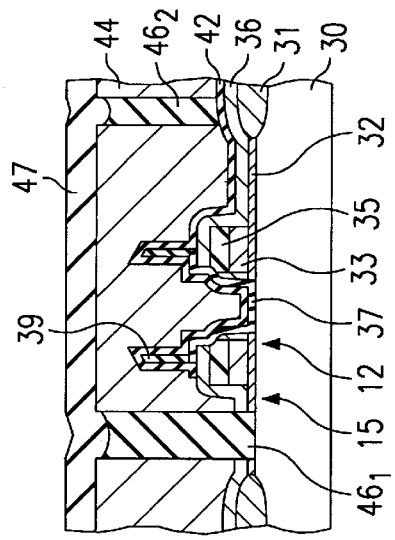
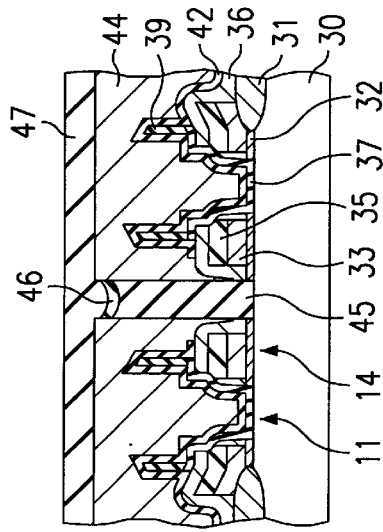
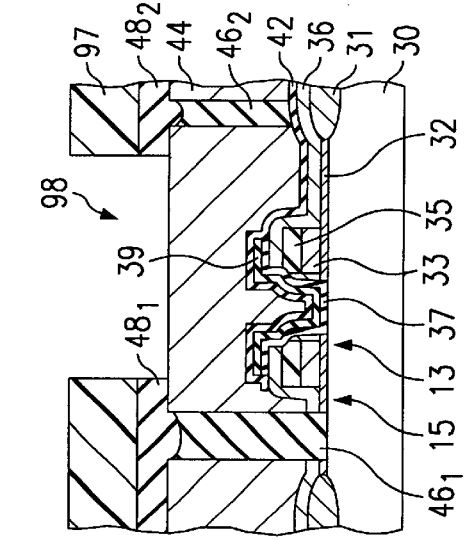
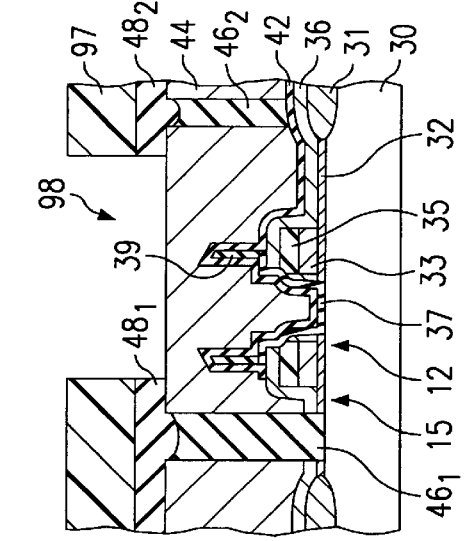
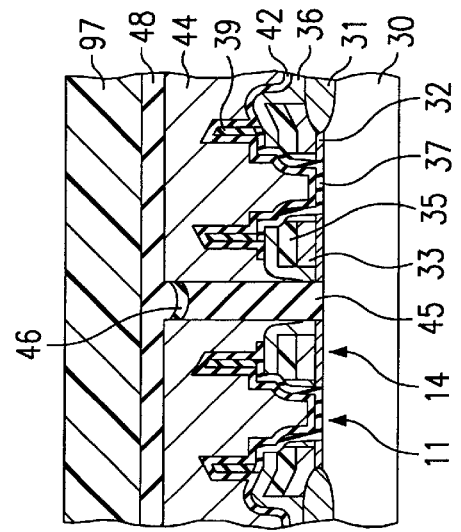

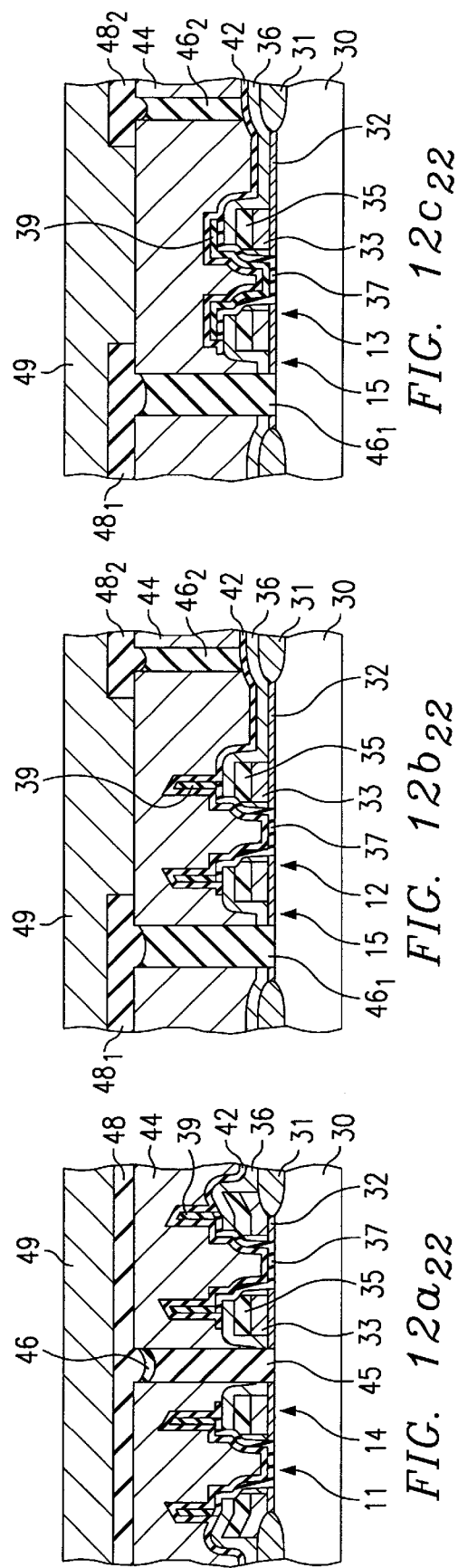

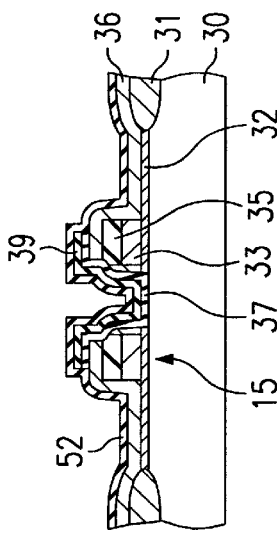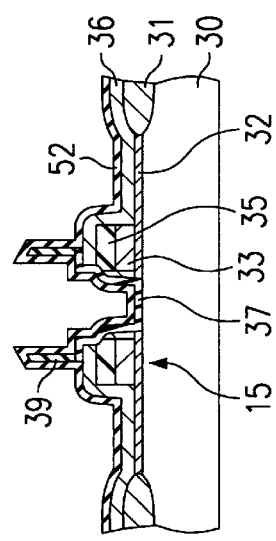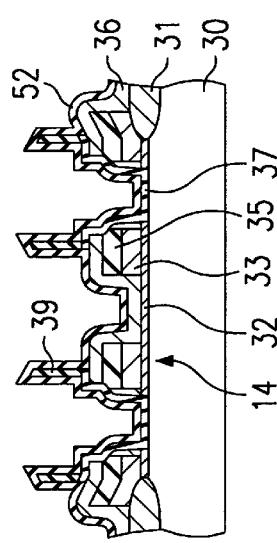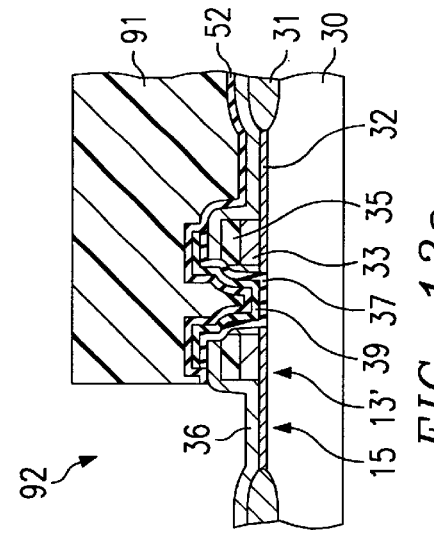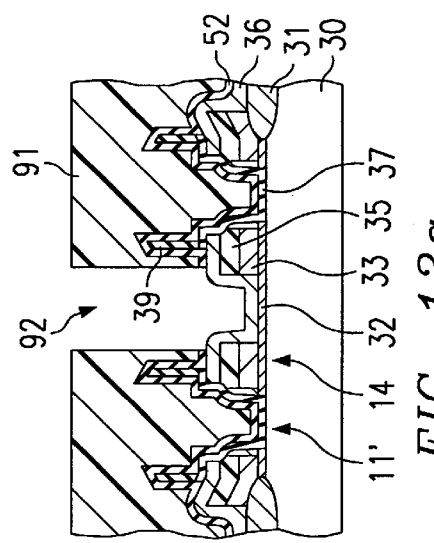

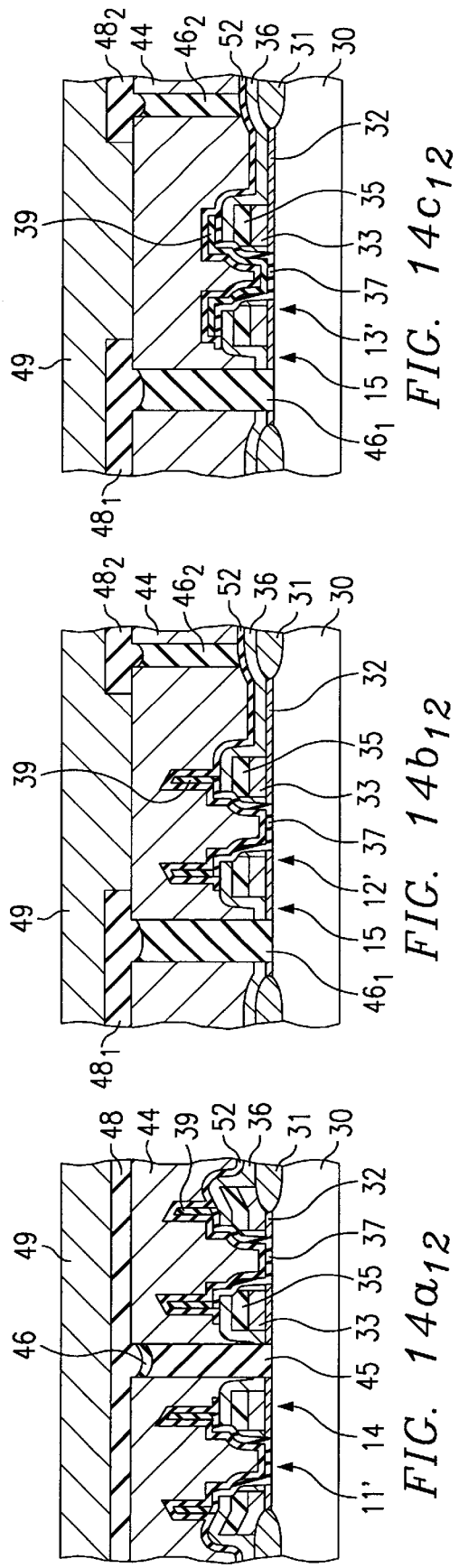

SEMICONDUCTOR MEMORY DEVICE WITH ANTIFUSE

FIELD OF THE INVENTION

The invention pertains to an antifuse used for a semiconductor. In particular, this invention pertains to an antifuse used for a semiconductor memory device.

BACKGROUND OF THE INVENTION

The current semiconductor device usually has a very high integrity. Consequently, in order to prevent the entire semiconductor device from becoming a defective product because of a partial defective circuit, a redundant circuit is formed in advance so that the defective circuit detected by examination can be switched to the redundant circuit.

In general, fuses are prearranged in the semiconductor device. When it is necessary to switch a defective circuit to the redundant circuit, the fuse corresponding to the defective circuit is cut off by a laser beam, followed by programming according to the state of the fuses. In this way, the defective circuit can, in practice, be switched to the redundant circuit.

However, the wiring width becomes narrower to accompany the improvement in the integrity of the semiconductor device. On the other hand, the spot size of the laser beam cannot be reduced. As a result, the fuses cannot be arranged close to each other.

Consequently, the technology using antifuses in a semiconductor device has attracted much attention in recent years. According to this technology, programming is performed after the antifuse corresponding to a defective circuit is shorted by applying a prescribed voltage.

FIG. 18 shows an example of the conventional antifuse. As shown in the figure, lower wiring 211 and upper wiring 212 on an insulating film formed on the surface of the lower wiring are connected to circuit modules 221 and 222, respectively. Each crossing part of lower wiring 211 and upper wiring 212 is used as an antifuse 205. When a prescribed breakdown voltage (5–20 V) is applied to an antifuse 205 corresponding to a defective circuit, the insulating film sandwiched between lower wiring 211 and upper wiring 212 in the portion of said antifuse 205 is punctured. As a result, a short circuit is formed between lower wiring 211 and upper wiring 212, and the desired circuit blocks in circuit modules 221 and 222 are connected to lower wiring 211 and upper wiring 212, respectively. In this way, the problem caused by the defective circuit can be solved.

Symbol 251 in FIG. 19 represents a diffused layer formed in silicon substrate 250. The two ends of the diffused layer are connected to film wiring 241. An ONO film (oxide/nitride/oxide film) 253 is formed as an insulating film on diffused layer 251, and a polysilicon film 252 with its two ends connected to film wiring 242 is formed on said ONO film 253. An antifuse 245 is formed at the intersection of diffused layer 251 and polysilicon film 252.

FIG. 20 shows a cross-sectional view along line A—A of said antifuse 245. When antifuse 245 is shorted, a prescribed voltage is applied between two wirings 251 and 252 to puncture ONO film 253 between diffused layer 251 and polysilicon film 252. As a result, a short circuit is formed between wirings 251 and 252.

There is no need to use a laser beam if electrically shorted antifuses are used as described above. Consequently, the antifuses can be arranged close to each other so that the area occupied by the chip can be reduced.

Unlike the fuse cut off by the laser beam, the punctured surface of the antifuse is not exposed to the surface of the semiconductor device. Therefore, a highly-reliable semiconductor device can be obtained because moisture and impurities cannot enter the punctured surface.

However, when said antifuses 205 and 245 are used in the semiconductor memory device, it is necessary to use a special-purpose film for forming antifuses 205 and 245 in a process separate from the process for forming the memory cell and the peripheral circuit. Consequently, the manufacturing cost is increased, while the yield drops as a result of using more films.

An object of this invention is to solve the aforementioned problems of the conventional technology by providing a semiconductor memory device having antifuses without adding a film manufacturing process.

SUMMARY OF THE INVENTION

This and other objects are attained, in accordance with one aspect this invention discloses a semiconductor memory device characterized by the following facts: data is stored when a capacitor comprising a first electrode formed on a semiconductor substrate, a dielectric film formed on the surface of the aforementioned first electrode, and a second electrode formed on the surface of the aforementioned dielectric film is charged or discharged; the semiconductor memory device has an antifuse formed by the aforementioned first and second electrodes as well as the dielectric film; the semiconductor memory device also has a MOS transistor which is connected in series with the aforementioned antifuse; when a breakdown voltage higher than the voltage applied to the aforementioned capacitor is applied to the circuit formed by the aforementioned antifuse and MOS transistor which are connected in series with each other, the aforementioned MOS transistor is turned on; at that time, the aforementioned dielectric film of the antifuse is punctured to form a short circuit between the aforementioned first and second electrodes.

When the semiconductor memory device of this invention has a first polysilicon film formed on the aforementioned semiconductor substrate and a second polysilicon film formed on the aforementioned first polysilicon film, the first electrode of the aforementioned capacitor and antifuse can be formed by the aforementioned first polysilicon film and the second polysilicon film deposited on the first polysilicon film.

On the other hand, when the first electrode of the aforementioned capacitor is formed by the aforementioned first polysilicon film and the second polysilicon film deposited on the first polysilicon film, the first electrode of the aforementioned antifuse can be formed by the aforementioned first polysilicon film and the aforementioned second polysilicon film formed on the surface of the first polysilicon film. The second electrode can be formed by a metal film.

In a further aspect of the invention, one end of another MOS transistor is connected to the mode between the aforementioned antifuse and MOS transistor, and a power supply voltage lower than the aforementioned breakdown voltage can be applied to the other end of said another MOS transistor.

As described in claim 6 of this invention, in the semiconductor memory device described in any of claims 1–5, plural circuits, each of which is formed by connecting the aforementioned antifuse and MOS transistor in series, are connected in parallel to form an antifuse array which is configured appropriately so that one antifuse of the aforementioned plural antifuses can be punctured at the desired position.

In the semiconductor memory device another aspect of this invention, a capacitor is formed by the first electrode formed on the semiconductor substrate, the dielectric film formed on the surface of the first electrode, and the second electrode formed on the surface of the dielectric film. The capacitor is charged or discharged to store the data.

The semiconductor memory device of a still further aspect of this invention also has an antifuse, which is formed by the first and second electrodes as well as the dielectric film, and a MOS transistor which is connected in series with the antifuse. When the data is stored, if the MOS transistor is turned on by applying a breakdown voltage higher than the voltage applied to the MOS transistor to the circuit formed by connecting the antifuse and the MOS transistor in series, the dielectric film in the antifuse will be punctured. As a result, a short circuit will be formed between the aforementioned first and second circuits. The programming can be carried out appropriately in electrical fashion to save the semiconductor memory device with a redundant circuit by shorting the antifuse corresponding to the defective circuit.

In this case, there is no need to use a laser beam, and the antifuse is formed by the same electrodes and dielectric film as those used for forming the capacitor. Consequently, there is no need to use a special-purpose film to form the antifuse, and the rise in the manufacturing cost caused by adding more processes can be avoided.

Also, the semiconductor memory device has a first polysilicon film formed on the semiconductor substrate and a second polysilicon film formed on the first polysilicon film. The first electrode of the capacitor in the memory cell is formed by the first polysilicon film and the second polysilicon film deposited on the first polysilicon film. In this case, if the first electrode for the antifuse is also formed by the first polysilicon film and the second polysilicon film deposited on the first polysilicon film, design and arrangement of the antifuse can be facilitated because the capacitor and the antifuse have the same configuration.

On the other hand, the antifuse can be made smaller than the capacitor if the first electrode of the antifuse is formed by the first polysilicon film and the second polysilicon film formed on the surface of the first polysilicon film, while the first electrode of the capacitor still has the second polysilicon film deposited on the first polysilicon film. In this case, the dielectric film has no contact with the first polysilicon film.

Although the second electrode of the capacitor and antifuse can also be formed with a polysilicon film, it is preferable to use a metal film for the purpose of low resistance.

When the aforementioned antifuse is shorted, the MOS transistor connected in series with the antifuse is turned on, and a breakdown voltage is applied to the antifuse to puncture the dielectric film. However, it is also possible to connect one end of another MOS transistor to the connecting part between the antifuse and the MOS transistor and apply a power supply voltage below the breakdown voltage to the other end of said another MOS transistor. If the MOS transistor is turned on before the antifuse is shorted, the high breakdown voltage will not be applied at the time that the MOS transistor connected in series with the antifuse is switched from the off state to the on state. Consequently, the MOS transistor will not deteriorate or become damaged.

In addition, plural circuits, each of which is formed by connecting the aforementioned antifuse and MOS transistor in series, can be arranged in parallel to form an antifuse array, and one of the antifuses can be punctured at the desired position. In this case, since shorting the antifuse and switching to the redundant circuit can be performed according to an address signal, the circuit configuration is simplified.

BRIEF DESCRIPTION OF THE DRAWINGS

FIGS. 1 ($a_1$)–($c_1$) and ($a_2$)–($c_2$) are diagrams explaining the first example of the process for manufacturing the semiconductor memory device of this invention.

FIGS. 2 ($a_3$)–($c_3$) and ($a_4$)–($c_4$) are diagrams explaining the manufacturing process in continuation.

FIGS. 3 ($a_5$)–($c_5$) and ($a_6$)–($c_6$) are diagrams explaining the manufacturing process in continuation.

FIGS. 4 ($a_7$)–($c_7$) and ($a_8$)–($c_8$) are diagrams explaining the manufacturing process in continuation.

FIGS. 5 ($a_9$)–($c_9$) are diagrams explaining the manufacturing process in continuation.

FIGS. 6 ($a_{10}$)–($c_{10}$) and ($a_{11}$)–($c_{12}$) [sic; ($c_{11}$)] are diagrams explaining the manufacturing process in continuation.

FIGS. 7 ($a_{12}$)–($c_{12}$) and ($a_{13}$)–($c_{13}$) are diagrams explaining the manufacturing process in continuation.

FIGS. 8 ($a_{14}$)–($c_{14}$) and ($a_{15}$)–($c_{15}$) are diagrams explaining the manufacturing process in continuation.

FIGS. 9 ($a_{16}$)–($c_{16}$) and ($a_{17}$)–($c_{17}$) are diagrams explaining the manufacturing process in continuation.

FIGS. 10 ($a_{18}$)–($c_{18}$) and ($a_{19}$)–($c_{19}$) are diagrams explaining the manufacturing process in continuation.

FIGS. 11 ($a_{20}$)–($b_{20}$) and ($a_{21}$)–($c_{21}$) are diagrams explaining the manufacturing process in continuation.

FIGS. 12 ($a_{22}$)–($c_{22}$) are diagrams explaining the second example of the process for manufacturing the semiconductor memory device of this invention.

FIGS. 13 ($a_{10}$)–($c_{10}$) and ($a_{11}$)–($c_{11}$) are diagrams explaining the manufacturing process in continuation.

FIGS. 14 ($a_{12}$)–($c_2$) are diagrams explaining the manufacturing process in continuation.

Figure 15A:
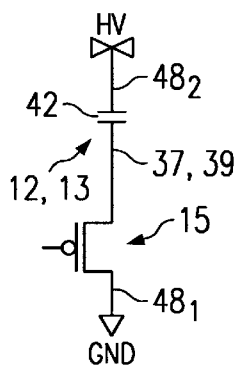
FIGS. 15 ($a$)–($d$) are diagrams illustrating an example of the circuit for shorting the antifuse in the semiconductor memory device of this invention.

REFERENCE NUMERALS AND SYMBOLS AS SHOWN IN THE DRAWINGS 11 and 11' represents a capacitor, and 12,12',13,13' an antifuse, 14' and 15 a MOS transistor, 16 another MOS transistor, 30 a semiconductor substrate, 37 the first polysilicon film, 39 the second polysilicon film, HV a breakdown voltage, $V_{DD}$ a power supply voltage $V_{DD}$.

DESCRIPTION OF THE EMBODIMENTS

The semiconductor memory device disclosed in an embodiment of this invention will be explained together with its manufacturing process.

FIGS. 1–14 illustrate the first example of the manufacturing process. In each diagram of FIGS. 1–14, ($a_n$)–($c_n$) represent different regions of the same semiconductor memory device formed on silicon substrate 30. In FIGS. 1–14, ($a_n$) represents the memory cell region used for storing the data, ($b_n$) represents the antifuse region of the memory cell structure, and ($c_n$) represents the antifuse region of a reduced structure.

First, as shown in FIGS. 1($a_1$)–($c_1$), LOCOS [local oxidation of silicon] oxide film 31 and gate oxide film 32 are formed on the surface of silicon substrate 30. A word line 33 made of a patterned polysilicon film and silicon oxide film 35 on the surface of said word line 33 are formed on gate oxide film 32. Then, silicon oxide film 36 is formed on the entire surface.

In the memory cell region, an N-channel MOS transistor 14 is formed with a diffused layer (not shown in the figure) in silicon substrate 30, gate oxide film 32, and word line 33 (FIG. 1($a_1$)). In the antifuse region, a P-channel MOS transistor 15 is formed by diffused layers with different conductivity types (FIGS. 1($b_1$) and 1($c_1$)).

Then, a patterned resist film 81 is formed on the surface of silicon oxide film 36. Silicon oxide film 36 exposed at the bottom of window part 82 formed in resist film 81 is removed by etching. In this case, gate oxide film 32 under the removed silicon oxide film 36 is also removed, and the surface of silicon substrate 30 is exposed (FIGS. 1($a_2$)–($c_2$)).

At that time, the side surface of word line 33 is covered by silicon oxide film 36. When the first polysilicon film 37 is formed on the entire surface after resist film 81 is removed, the first polysilicon film 37 is electrically connected to silicon substrate 30 but is electrically insulated from word line 33 (FIGS. 2($a_3$)–($c_3$)).

Nitride 38 is deposited on the surface of the first polysilicon film 37 (FIGS. 2($a_4$)–($c_4$)), and a patterned resist film 83 is formed on the surface of nitride 38.

In the memory cell region and the antifuse region of the memory cell structure, the portions where silicon oxide film 36 has been removed are protected by resist film 83, while windows 84 are formed in other portions. On the other hand, in the antifuse region of the reduced structure, a window 84 is formed on the entire surface. When nitride 38 exposed at the bottom of each window 84 is removed by etching, the first polysilicon film 37 acts as a stopper, and nitride 38 is patterned.

As a result, nitride 38 is studded in an island pattern in the memory cell region and the antifuse region of the memory cell structure, while nitride 38 in the antifuse of the reduced structure is completely removed (FIGS. 3($a_5$)–($c_5$)).

When the second polysilicon film 39 is formed on the surface after resist film 83 is removed, the surface and side of nitride 38 that is studded in an island pattern are covered by the second polysilicon film 39 (FIGS. 3($a_6$) and ($b_6$)). At that time, the second polysilicon film 38 is formed on the surface of the first polysilicon film 37 in the antifuse region of the reduced structure (FIG. 3($c_6$)).

Subsequently, a patterned resist film 85 is formed on the surface to protect the entire surface in the antifuse region of the reduced structure (FIG. 4 ($c_7$)). Windows 86 are formed on the memory cell region and the antifuse region of the memory cell structure to expose the second polysilicon film 39.

When anisotropic etching is performed, the first and second polysilicon films 37 and 39 on silicon oxide film 36 are etched in the depth direction in the memory cell region and the antifuse region of the memory cell structure to expose the surfaces of silicon oxide film 36 and nitride 38 (FIGS. 4($a_7$) and ($b_7$)).

At that time, the first polysilicon film 37 is left over under nitride 38, and the second polysilicon film 39 is connected to the first polysilicon film 37 on the side.

After resist film 85 is removed, nitride 38 is removed. Then, a patterned resist film 87 is formed on the surface.

The memory cell region and the antifuse of the memory cell structure are protected by resist film 87 (FIGS. 4($a_8$) and ($b_8$). The second polysilicon film 39 in the antifuse region of the reduced structure is exposed to window 88 formed in resist film 87. When the second polysilicon film 39 and the first polysilicon film 37 are sequentially etched, silicon oxide film 36 is exposed in the antifuse region of the reduced structure (FIG. 4 ($c_8$)

When resist film 87 is removed, the second polysilicon film 39 formed on the side surface of nitride 38 in the memory cell region and the antifuse region of the memory cell structure is deposited on the first polysilicon film 37 (FIGS. 5($a_9$) and ($b_9$)).

On the other hand, in the antifuse region of the reduced structure, the second polysilicon film 39 is laminated on the first polysilicon film 37.

In the first example of the process for manufacturing the semiconductor memory device, a metal film is used for the plate electrode. When metal film 41 is formed on the surface of the semiconductor memory device in the state shown in FIGS. 5($a_9$)–($c_9$), the surfaces of the first polysilicon film 37, the silicon oxide film 36, and the second polysilicon film 39 deposited on the first polysilicon film 37 are covered by said metal film 41 (FIGS. 6($a_{10}$) and ($b_{10}$)).

In the antifuse region of the simple structure, the surface of the second polysilicon film 39 laminated on the surface of the first polysilicon film 37 and the surface of silicon oxide film 36 are covered by metal film 41 (FIG. 6($c_{10}$)). When a heat treatment is performed at that time, the resistance of the portion where metal 41 is in contact with the first polysilicon film 37 or the second polysilicon film 39 is reduced.

Subsequently, after metal film 41 is removed by etching, a dielectric film and a metal film are formed sequentially on the entire surface to obtain laminated film 42 (FIGS. 6($a_{11}$)–($c_{11}$)).

At that time, the second polysilicon film 39 is deposited and connected to the first polysilicon film 37 in the memory cell region and the antifuse region of the memory cell structure. Consequently, laminated film 42 is formed not only on the surfaces of the first polysilicon film 37 and silicon oxide film 36 but also around the surface of the deposited second polysilicon film 39.

On the other hand, in the antifuse region of the simple structure, laminated film 42 is formed on the surfaces of the second polysilicon film 39 and silicon oxide film 36. The laminated film makes no contact with the first polysilicon film 37 on the bottom of the second polysilicon film 39.

A patterned resist film 91 is formed on the surface of said laminated film 42. Laminated film 42 exposed at the bottom of window part 92 is removed by etching, and laminated film 42 is divided into several portions to form a plate wiring. Formation of the plate wiring completes the formation of capacitor 11 for storing data in the memory cell region (FIG. 7($a_{12}$)). The first and second polysilicon films 37 and 39 form one of the electrodes of the capacitor, while the metal film in laminated film 42 forms the other electrode. The two electrodes of capacitor 11 are insulated from each other by the dielectric film in laminated film 42. An antifuse 12 having the same configuration as said capacitor 11 is formed in the antifuse region of the memory cell structure (FIG. 7($b_{12}$)).

On the other hand, antifuse 13 is formed in the antifuse region of the reduced structure (FIG. 7($c_{12}$)). The second polysilicon film 39 (and the first polysilicon film 37 under the second polysilicon film) forms one of the electrodes, while the metal film in laminated film 42 forms the other electrode.

When silicon oxide film 44 is deposited on the surface after resist film 91 is removed, capacitor 11 and antifuse 12 or 13 are filled with silicon oxide film 44 (FIGS. 7($a_{13}$)–($c_{13}$)).

Then, a patterned resist film 93 is formed on silicon oxide film 44, and a window part 94 is formed between capacitors 11 in the memory cell region. When the silicon oxide film 44 exposed at the bottom of window part 94 is etched, silicon oxide film 36 and gate oxide 32 under the silicon oxide film 44 are also removed by etching to form a hole (94') with the surface of silicon substrate 30 exposed at the bottom (FIG. 8($a_{14}$)).

In this case, no window part 94 is formed on the side of the antifuse. The antifuse is protected by resist film 93, and hole (94') is not formed in the antifuse region (FIGS. 8($b_{14}$) and ($c_{14}$) ).

When a contact wiring 45 made of a third polysilicon film is formed on silicon oxide film 44 after resist film 93 is removed, hole (94') is filled up with contact wiring 45 (FIGS. 9($a_{15}$)–($c_{15}$)).

Subsequently, when contact wiring 45 is etched, the contact wiring 45 in hole (94') is left over, while the contact wiring 45 on the surface of silicon oxide film 44 is removed (FIGS. 9 ($a_{16}$)–($c_{16}$))

Then, a patterned resist film 95 is formed on the surface of the exposed silicon oxide film 44. When silicon oxide film 44 exposed at the bottom of window part 96 formed in the antifuse region is etched, a hole (961) is formed (FIGS. 9($b_{17}$) and ($c_{17}$)). Silicon substrate 30 or laminated film 42 is exposed at the bottom of said hole (96').

In this case, the entire surface of capacitor 11 is protected by resist film 95 (FIG. 9($a$17)).

When a metal film 46 is formed on the entire surface with the surface of silicon oxide film 44 exposed after resist film 95 is removed, hole (96') is filled with said metal film 46 (FIGS. 10 ($a_{18}$)–($c_{18}$)).

Subsequently, when metal film 46 formed on the surface of silicon oxide film 44 is etched, contact wiring $46_1$ connected to silicon substrate 30 and contact wiring $46_2$ connected to laminated film 42 are formed by metal film 46 filled in hole (96') on the side of the antifuse region (FIGS. 10($b_{19}$) and ($c_{19}$)). On the side of the memory cell region, residue of metal film 46 remains on contact wiring 45 connected to silicon substrate 30 (FIG. 10($a_{19}$)).

When a metal film 47 for wiring is formed on the surface of silicon oxide film 44 exposed after metal film 46 is removed, contact wirings $46_1$ and $46_2$ in the antifuse region are connected to metal film 47 for wiring (FIGS. 11($b_{20}$) and ($c_{20}$)). Contact wiring 45 in the memory cell region is connected through the residue of metal film 46 (FIG. 11($a_{20}$)).

Then, a patterned resist film 97 is formed on the surface of metal film 47 for wiring, and the unwanted portions of said metal film 47 are removed by etching to form bit lines 48, $48_1$, and $48_2$ (FIGS. 11($a_{21}$)–($c_{21}$)).

At that time, in the memory cell region, bit line 48 is connected to one of the electrodes (the first and second polysilicon films 37 and 39) of capacitor 11 used for storing data through metal film 46, polysilicon film 45, and N-channel MOS transistor 14. The other electrode (on the side of laminated film 42) of capacitor 11 is connected to a pad to which ground potential is applied during the operation. One bit line 48 is connected to plural capacitors 11.

In the antifuse region of the memory cell structure, bit line $48_1$ is connected to one of the electrodes of antifuse 12 through contact wiring $46_1$ and P-channel MOS transistor 15. Also, bit line $48_2$ is connected to the other electrode of antifuse 12 through contact wiring $46_2$.

Similarly, in the antifuse region of the reduced structure, bit line 48 is connected to one of the electrodes of antifuse 13 through contact wiring 46, and P-channel MOS transistor 15. Also, bit line $48_2$ is connected to the second electrode through contact wiring $46_2$. Said bit lines 48, $48_1$, and $48_2$ are connected to the internal circuit of the semiconductor memory device.

After resist film 97 is removed, silicon oxide film 49 is deposited on the surface (FIGS. 12($a_{22}$)–($c_{22}$)). Then, wiring made of a metal film and an inter-layer insulating film made of a silicon oxide film are sequentially laminated to connect the various circuits to each other. In this way, a semiconductor memory device is obtained. In the memory cell region, a memory cell is formed by capacitor 11 and N-channel MOS transistor 14 which is connected in series to capacitor 11. In the antifuse region, an antifuse circuit is formed by antifuse 12 or 13 and P-channel MOS transistor 15 which is connected in series with said antifuse 12 or 13.

In the memory cell region, the other electrode (on the side of laminated film 42) is connected to ground potential. When N-channel MOS transistor 14 is turned on by word line 36, and when bit line 48 is connected to one of the electrodes of capacitor 11, capacitor 11 can be charged/discharged through bit line 48 to input/output data.

FIG. 15($a$) is an equivalent circuit diagram illustrating the antifuse circuit formed by antifuse 12 or 13 and P-channel MOS transistor 15.

As shown in FIG. 15($a$), one of the electrodes of antifuse 12 or 13 is connected to the source terminal of P-channel MOS transistor 15. A high breakdown voltage HV is applied to the other electrode, and the drain terminal of P-channel MOS transistor 15 is connected to the ground potential GND. If breakdown voltage HV is applied when P-channel MOS transistor 15 is in the off state, the voltages of both of the electrodes of antifuse 12 or 13 become said breakdown voltage HV.

When the gate terminal (word line 33) of P-channel MOS transistor 15 is connected to GND potential to turn on P-channel MOS transistor 15, breakdown voltage HV is applied between the two electrodes of antifuse 12 or 13.

The breakdown voltage of gate oxide film 32 is around 10 V. The power supply voltage $V_{DD}$ for the semiconductor memory device to operate in the normal state is set to 7 V. Consequently, when breakdown voltage HV is set to 15 V, P-channel MOS transistor 15 is turned on, and breakdown voltage HV is applied to the dielectric film of antifuse 12 or 13. As a result, the dielectric film is punctured, and a short circuit is formed between the two electrodes.

When the semiconductor memory device is used after antifuse 12 or 13 is shorted, power voltage $V_{DD}$ is used instead of breakdown voltage HV, and power voltage $V_{DD}$ is applied to the second electrode of antifuse 12 or 13.

When P-channel MOS transistor 15 is shorted, power voltage $V_{DD}$ is present at the source terminal for the antifuse 12 or 13 to be shorted, while ground potential GND is present at the antifuse 12 or 13 that will not be shorted. Consequently, it is possible to determine whether antifuse 12 or 13 should be cut off by detecting the voltage at the source terminal of P-channel MOS transistor 15.

Figure 15B:
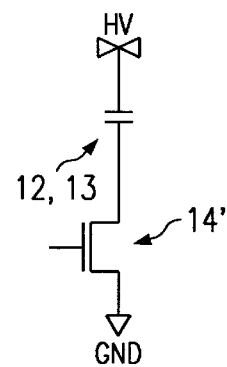

FIG. 15(b) shows the case when an N-channel MOS transistor (14') having the same configuration as N-channel MOS transistor 14 in the memory cell region is used to replace P-channel MOS transistor 15. When the gate terminal of N-channel MOS transistor (14') is changed from ground potential GND to power supply voltage $V_{DD}$, N-channel MOS transistor (14') is turned on, and the dielectric film of antifuse 12 or 13 is punctured to form a short circuit between the two electrodes. It is possible to determine whether antifuse 12 or 13 is shorted by detecting the voltage at the drain terminal of N-channel MOS transistor (14') in the antifuse circuit.

In the antifuse circuits shown in FIGS. 15(a) and (b), one MOS transistor, that is, transistor 15 or (14') is used to short antifuse 12 or 13. In this case, however, breakdown voltage HV has been applied to the electrode connected to antifuse 12 or 13 of MOS transistor 15 or (14') before the dielectric film is punctured. For example, when P-channel MOS transistor 15 is turned on in the antifuse circuit shown in FIG. 15(a), breakdown voltage HV is applied to the part on the side of the source terminal of gate oxide film 32 at the moment that the gate terminal (word line 33) is connected to ground potential GND.

Breakdown voltage HV is applied to gate oxide film 32 for a short period of time until P-channel MOS transistor 15 is completely turned on. Since breakdown voltage HV is set to such a high level that antifuse 12 or 13 can be surely punctured, gate oxide film 32 will also be punctured.

Figure 15C:
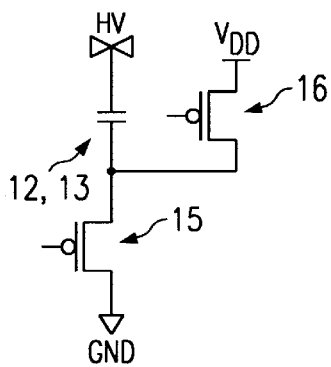

In the circuit shown in FIG. 15(c), a power voltage $V_{DD}$ below breakdown voltage HV is used. The source terminal of P-channel MOS transistor 15 is connected to power voltage $V_{DD}$ through another P-channel MOS transistor 16. When P-channel MOS transistor 15 connected in series with antifuse 12 or 13 is in the off state, said P-channel MOS transistor 16 is turned on, and the source terminal of P-channel MOS transistor 15 is clamped to power supply voltage $V_{DD}$. Consequently, antifuse 12 or 13 is precharged to a voltage of HV-$V_{DD}$.

Then, when P-channel MOS transistor 15 is turned on while P-channel MOS transistor 16 is turned off, breakdown voltage HV can be applied to the dielectric film of antifuse 12 or 13 without applying breakdown voltage HV to the source terminal of P-channel MOS transistor 15. Consequently, antifuse 12 or 13 can be shorted without puncturing gate oxide film 32 of P-channel MOS transistor 15.

Figure 15D:
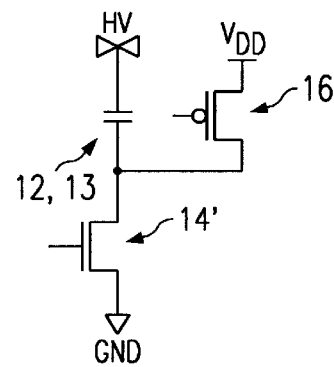

Similarly, in the circuit shown in FIG. 15(d), the drain terminal of N-channel MOS transistor (14') is connected to power supply voltage $V_{DD}$ through P-channel MOS transistor 16, and breakdown voltage HV is not applied to N-channel MOS transistor (14'). In this case, the drain terminal of N-channel MOS transistor (14') is also clamped to power supply voltage $V_{DD}$, and the gate oxide film is not punctured.

In the following, the case of using plural antifuses 12 or 13 to save the defective circuits will be explained.

Figure 16:
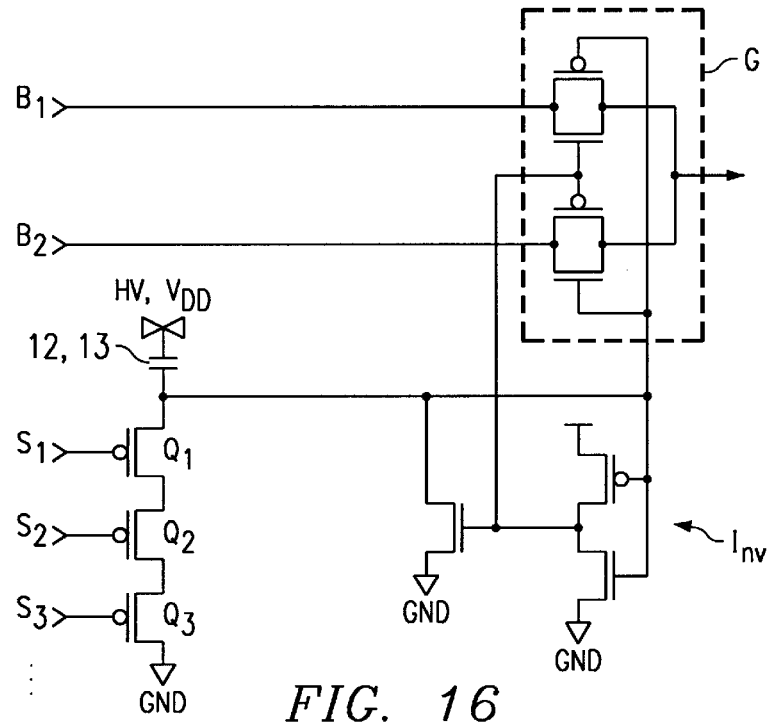
FIG. 16 is a diagram illustrating an example of the internal circuit of the semiconductor memory device disclosed in this invention.

In the circuit shown in FIG. 16, three P-channel MOS transistors $Q_1$–$Q_3$ are connected in series with one antifuse 12 or 13. When all P-channel MOS transistors $Q_1$–$Q_3$ are turned on, antifuse 12 or 13 is shorted.

Signals $S_1$–$S_3$ are input to the gate terminals of P-channel MOS transistors $Q_1$–$Q_3$, respectively. When all signals $S_1$–$S_3$ are at the low level, all P-channel MOS transistors $Q_1$–$Q_3$ are on, and antifuse 12 or 13 is shorted. On the other hand, if one of signals $S_1$–$S_3$ is at the high level, antifuse 12 or 13 is not shorted.

After signals $S_1$–$S_3$ are input to P-channel MOS transistors $Q_1$–$Q_3$ to short antifuse 12 or 13 at the desired position (including the antifuses not shown in the figure), the voltage applied to antifuse 12 or 13 is changed from breakdown voltage HV to power supply voltage $V_{DD}$. If antifuse 11 or 12 is not shorted, ground potential GND will be output to transfer gate G and inverter Inv in the subsequent stage. On the other hand, if the antifuse is shorted, power supply voltage $V_{DD}$ will be output.

When ground potential GND is output to transfer gate G and inverter Inv, signal $B_1$, one of signals $B_1$ and $B_2$, is output by transfer gate G. When power supply voltage $V_{DD}$ is output, the other signal $B_2$ will be output.

If signal $B_1$ is output from transfer gate G during actual operation, the circuit corresponding to said antifuse 12 or 13 will be determined to be a good circuit and will not be replaced by the redundant circuit. As a result, the operation of the semiconductor memory device is not changed. If signal $B_2$ is output, antifuse 12 or 13 is shorted. The circuit corresponding to the antifuse is determined to be a defective circuit, and the redundant circuit is activated. If the semiconductor memory device is saved by the redundant circuit according to the output from transfer gate G, the semiconductor memory device will not be damaged as long as there are sufficient redundant circuits.

Figure 17:
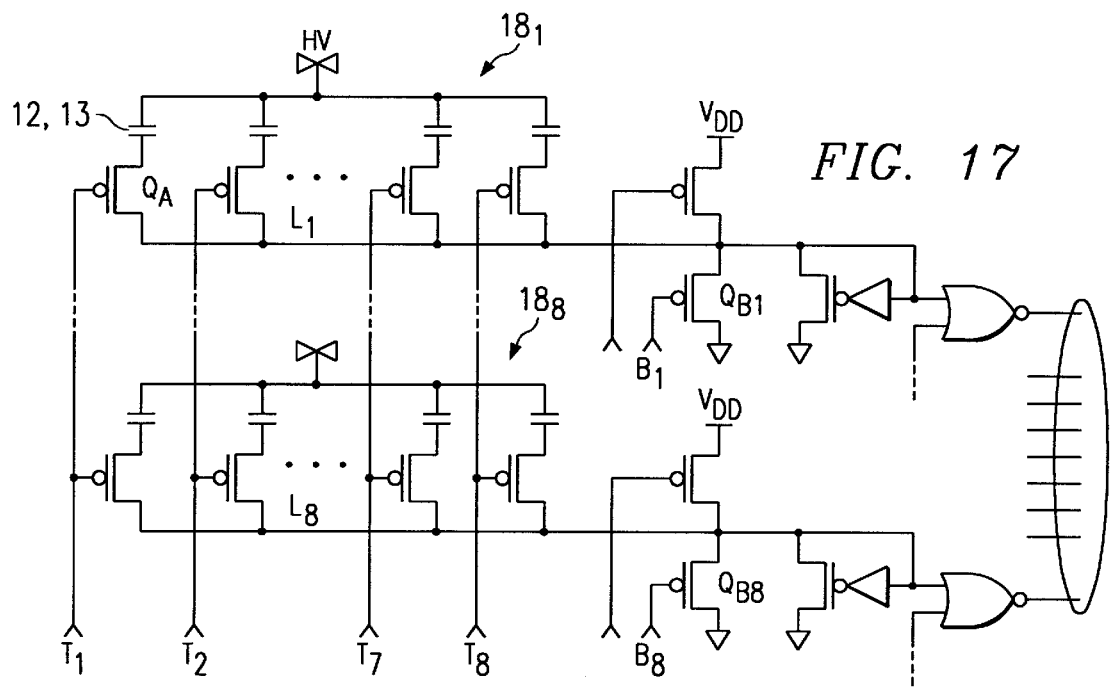
FIG. 17 is a diagram illustrating another example of the internal circuit of the semiconductor memory device disclosed in this invention.
Figure 18:
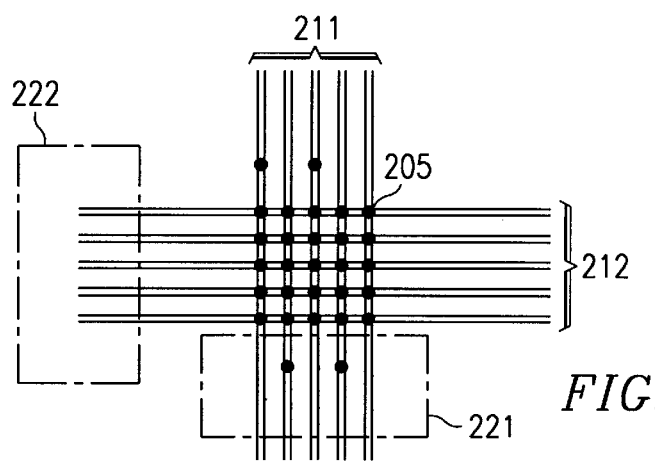
FIG. 18 is a diagram illustrating an example of the conventional antifuse.
Figure 19:
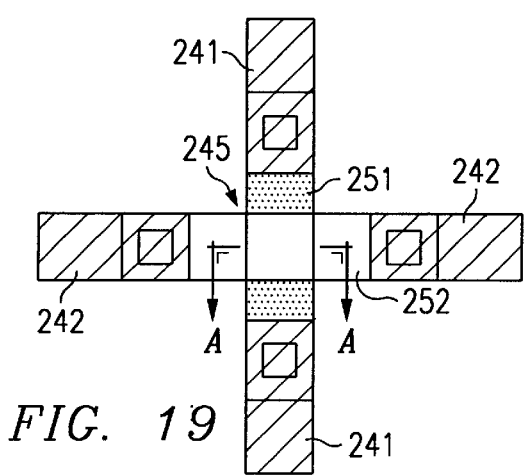
FIG. 19 is a diagram illustrating another example of the conventional antifuse.
Figure 20:
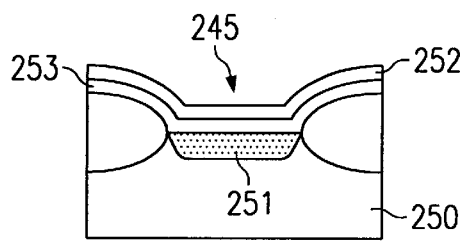
FIG. 20 is a cross-sectional view along line A—A of FIG. 19.

FIG. 17 shows the case in which 8 circuits, each of which is formed by connecting antifuse 12 or 13 and P-channel MOS transistor $Q_A$ in series with each other, are connected in parallel with each other to form one set of antifuse array 18. In FIG. 17, 8 sets of antifuse arrays $18_1$–$18_8$ are connected in parallel with each other, and antifuses 12 or 13 are arranged like a matrix.

For each of the eight P-channel MOS transistors $Q_A$ connected in series with antifuses 12 or 13, the source terminal is metal filmed to antifuse 12 or 13, and the drain terminal is connected to one of common signal lines $L_1$–$L_8$. Said signal lines $L_1$–$L_8$ are connected to ground potential GND through P-channel MOS transistors $QB_1$–$QB_8$, respectively.

P-channel MOS transistors $QB_1$–$QB_8$ connected to signal lines $L_1$–$L_8$ can be turned on/off individually by signals $B_1$–$B_8$. On the other hand, the eight P-channel MOS transistors $Q_A$ in one set are turned on/off by signals $T_1$–$T_8$.

When signals $T_1$–$T_8$ are combined with signals $B_1$–$B_8$, it is possible to obtain address signals that can be used to specify antifuse 12 or 13 at the desired position. In the test operation, when an address signal corresponding to a defective circuit is input with breakdown voltage HV applied to one end of each of antifuse arrays $18_1$–$18_8$, the antifuse 12 or 13 at the position corresponding to the defective circuit in each of antifuse array $18_1$–$18_8$ can be shorted.

When the voltage applied to antifuse arrays $18_1$–$18_8$ is changed from breakdown voltage HV to power supply voltage $V_{DD}$ in actual operation, the address signal indicating the defective circuit is input to antifuse arrays $18_1$–$18_8$. At that time, signal lines $L_1$–$L_8$ are connected to power supply voltage $V_{DD}$ by the shorted antifuse 12 or 13, and power supply voltage $V_{DD}$ is output from signal lines $L_1$–$L_8$. Consequently, it is possible to determine whether the circuit indicated by the address signal is good or defective depending on the state of signal lines $L_1$–$L_8$.

When an antifuse is shorted by the address signal as described above, the defective circuit can be saved automatically. Consequently, the internal circuit of the semiconductor memory device can be simplified.

In the aforementioned capacitor 11 and antifuse 12 or 13, one of the electrodes is formed by the first and second polysilicon films 37 and 39, while the other electrode is formed by the metal film in laminated film 42. However, in the second example of the manufacturing process to be explained below, a polysilicon film is used instead of the metal film.

The second example of the manufacturing process is identical to the first example until the second polysilicon film 39 is deposited on the first polysilicon film 37 (FIGS. 1–5). Subsequently, a dielectric film and a polysilicon film are formed sequentially on the entire surface to form laminated film 52 (FIGS. 13($a_{10}$)–($c_{10}$)).

Then, a patterned resist film 91 is formed on the surface of laminated film 52. The laminated film 52 exposed at the bottom of window part 92 is removed by etching, and laminated film 52 is divided to form a plate wiring. In this way, a capacitor (11') for storing data is formed in the memory cell region (FIG. 13($a_{11}$)). One of the electrodes of the capacitor is formed by the first and second polysilicon films 37 and 39, while the other electrode is formed by the polysilicon film in laminated film 52. The two electrodes are insulated from each other by the dielectric film in laminated film 52. Also, antifuse (12') with the same configuration as capacitor (11') is formed in the antifuse region of the memory cell structure (FIG. 13($b_{11}$)).

On the other hand, antifuse (13') is formed in the antifuse region of the reduced structure (FIG. 13($c_{11}$)). One of the electrodes of the antifuse is formed by the second polysilicon film 39 and the first polysilicon film 37 under the second polysilicon film, while the other electrode is formed by the polysilicon film in laminated film 52.

After antifuse (12'), (13') is formed, bit lines 48, $48_1$, and $48_2$ are formed by the same process described in the aforementioned first example, followed by formation of silicon oxide film 49 on the surface. Then, an inter-layer wiring and an inter-layer insulating film are laminated to form a semiconductor memory device. Said antifuse (12'), (13') is also shorted as a result of applying breakdown voltage HV by P-channel MOS transistor 15 which is connected in series with the antifuse.

Since said antifuses 12 and (12') have the same configurations as capacitors 11 and (11') for storing data, respectively, the design and arrangement of the semiconductor device can be simplified. Also, if antifuses 13 and (13') with the reduced structure are used, the configuration can be simplified. Consequently, antifuses with higher reliability than capacitors can be obtained.

According to this invention, since defective circuits are saved with antifuses, it is possible to perform programming in electrically without using a laser beam.

The manufacturing process is simplified because the same films as those of the capacitor in the memory cell can be used to form the antifuse.

If the antifuse is formed with the same configuration as the capacitor, the arrangement can be simplified. Also, if the antifuse with a reduced structure is used, the area of the semiconductor memory device can be reduced.

What is claimed is:

1. An antifuse circuit comprising:
    a first electrode formed on a semiconductor substrate;
    a dielectric film formed on a surface of said first electrode;
    a second electrode formed on a surface of said dielectric;
    a first MOS transistor coupled between a first power source and one of said first or second electrodes;
    a second MOS transistor coupled between a second power source and said one of said first or second electrodes;
    a third power source coupled to the other of said first or second electrodes, the difference of voltage between said first and third power sources being sufficient to puncture said dielectric film and wherein said second power source has a lower voltage which does not exceed said breakdown voltage of said dielectric layer, said second MOS transistor precharging said antifuse to the difference between said third and second power sources, whereby said dielectric film can be punctured without puncturing a dielectric layer of said first MOS transistor.

2. The antifuse circuit of claim 1 wherein a plurality of antifuse circuits are configured as an antifuse circuit array in which a single antifuse at a predetermined position can be punctured.

3. The antifuse circuit of claim 1 further comprising a semiconductor memory circuit.

4. The antifuse circuit of claim 3 wherein a plurality of antifuse circuits are configured as an antifuse circuit array in which a single antifuse at a predetermined position can be punctured.

5. The antifuse circuit of claim 1 wherein said second electrode is made of a metal film.

6. The antifuse circuit of claim 5 further comprising a semiconductor memory circuit.

7. The antifuse circuit of claim 5 wherein a plurality of antifuse circuits are configured as an antifuse circuit array in which a single antifuse at a predetermined position can be punctured.

8. The antifuse circuit of claim 1 wherein said second electrode is formed of a polysilicon film.

9. The antifuse circuit of claim 8 wherein a plurality of antifuse circuits are configured as an antifuse circuit array in which a single antifuse at a predetermined position can be punctured.

10. The antifuse circuit of claim 18 wherein a plurality of antifuse circuits are configured as an antifuse circuit array in which a single antifuse at a predetermined position can be punctured.

11. The antifuse circuit of claim 8 further comprising a semiconductor memory circuit.

12. The antifuse circuit of claim 11 wherein a plurality of antifuse circuits are configured as an antifuse circuit array in which a single antifuse at a predetermined position can be punctured.

13. The antifuse circuit of claim 1 wherein said first electrode is formed of a polysilicon film.

14. The antifuse circuit of claim 13 wherein said second electrode is made of a metal film.

15. The antifuse circuit of claim 13 wherein a plurality of antifuse circuits are configured as an antifuse circuit array in which a single antifuse at a predetermined position can be punctured.

16. The antifuse circuit of claim 13 further comprising a semiconductor memory circuit.

17. The antifuse circuit of claim 16 wherein a plurality of antifuse circuits are configured as an antifuse circuit array in which a single antifuse at a predetermined position can be punctured.

18. The antifuse circuit of claim 13 wherein said second electrode is formed of a polysilicon film.

19. The antifuse circuit of claim 18 further comprising a semiconductor memory circuit.

20. The antifuse circuit of claim 19 wherein a plurality of antifuse circuits are configured as an antifuse circuit array in which a single antifuse at a predetermined position can be punctured.

* * * * *